(12) United States Patent
Dudeck et al.

(10) Patent No.: US 7,301,828 B2
(45) Date of Patent: Nov. 27, 2007

(54) DECODING TECHNIQUES FOR READ-ONLY MEMORY

(75) Inventors: Dennis E. Dudeck, Hazleton, PA (US); Donald A. Evans, Lancaster, OH (US); Hai Q. Pham, Hatfield, PA (US); Wayne E. Werner, Coopersburg, PA (US); Ronald J. Wozniak, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 11/363,366

(22) Filed: Feb. 27, 2006

(65) Prior Publication Data

US 2007/0201281 A1 Aug. 30, 2007

(51) Int. Cl.
*G11C 7/00* (2006.01)

(52) U.S. Cl. .................... 365/189.08; 365/230.02; 365/190

(58) Field of Classification Search ............ 365/189.08
See application file for complete search history.

(56) References Cited

U.S. PATENT DOCUMENTS

| | | | |
|---|---|---|---|
| 3,728,696 A | 4/1973 | Polkinghorn | 340/173 |
| 4,287,571 A | 9/1981 | Chakravarti et al. | 365/104 |
| 4,901,285 A | 2/1990 | Sano et al. | 365/230.01 |
| 5,111,428 A | 5/1992 | Liang et al. | 365/104 |
| 5,528,534 A | 6/1996 | Shoji | 365/104 |
| 5,598,365 A | 1/1997 | Shoji | 365/104 |
| 5,663,677 A | 9/1997 | Freyman et al. | 327/565 |
| 5,904,526 A | 5/1999 | Wen et al. | 438/275 |
| 6,141,255 A | 10/2000 | Sunkavalli | |
| 6,151,249 A * | 11/2000 | Shirota et al. | 365/185.17 |
| 6,462,387 B1 | 10/2002 | Lai | 257/390 |
| 6,699,759 B2 | 3/2004 | Lai | 438/275 |
| 6,876,596 B1 | 4/2005 | Kirihara | |
| 7,233,540 B1 * | 6/2007 | Vinke et al. | 365/230.01 |
| 2001/0014051 A1 * | 8/2001 | Watanabe et al. | 365/230.03 |
| 2005/0213362 A1 | 9/2005 | Chang | |

OTHER PUBLICATIONS

Hodges et al., "Analysis and Design of Digital Integrated Circuits," McGraw-Hill, pp. 346-365 (1988).
Dudeck et al., "Layout Techniques for Read-Only Memory and the Like," U.S. Appl. No. 11/363,010, filed Feb. 27, 2006.

* cited by examiner

*Primary Examiner*—Thong Q. Le (57) ABSTRACT

A memory circuit includes a number of bit line structures, each including at least three bit lines; a number of word lines that intersect with the bit line structures at a number of sites; and a number of switching devices located at the sites. A number of column sense logic units are also provided, corresponding to the bit line structures. Each of the column sense logic units includes a first logic gate and a second logic gate. The first logic gate has a first input connected with a first one of the bit lines and a second input connected with a second one of the bit lines. The second logic gate has a first input interconnected with a third one of the bit lines, and a second input interconnected with the second one of the bit lines.

18 Claims, 10 Drawing Sheets

4 BITS

FIG. 9

2 BITS

DECODING TECHNIQUES FOR READ-ONLY MEMORY

FIELD OF THE INVENTION

The present invention relates generally to electronic circuitry, such as memory circuits, and more particularly to techniques for decoding information stored in such memory circuits.

BACKGROUND OF THE INVENTION

Memory circuits, such as read-only-memories (ROMS), are ubiquitous in modern computing devices. Efforts continue to achieve increased density, lower power, and better performance. Many current devices use a single transistor to store a single bit of data. There are density limits to such types of designs, as the ROM cell can be designed only as small as is possible within the limits of current manufacturing technology. Various prior art approaches have been plagued by undesirably increased memory access and cycle times, as well as undesirable increases in leakage current and bit line coupling.

U.S. Pat. No. 5,528,534 to Shoji discloses a high-density ROM employing multiple bit line interconnection. Data that would normally be represented by multiple bits of information is effectively stored at a single memory site within a ROM. This is accomplished by employing a multiple bit line memory architecture, in conjunction with a data decoder. With the arrangement disclosed in Shoji, it is possible to store, at a single memory site, information that would have required up to $\log_2(n(n-1)/2)+1$ individual memory sites in a conventional ROM (where n is the number of independent bit lines connected to an individual memory element in the invention). The Shoji invention is particularly well suited to what would be considered relatively low-speed data retrieval systems, such as those adapted to provide audio and/or video to a user on a real time basis.

Therefore, techniques for addressing the deficiencies of prior art approaches would be desirable.

SUMMARY OF THE INVENTION

Decoding techniques for ROM circuits are provided. In one aspect of the invention, an exemplary embodiment of a memory circuit includes a plurality of bit line structures, a plurality of word lines, a plurality of switching devices, and a plurality of column sense logic units. Each of the bit line structures includes at least three bit lines. The word lines intersect with the bit line structures at a plurality of sites. Individual ones of the switching devices are located at selected ones of the sites and are connected between an adjacent one of the word lines and a selected one of the bit lines of an adjacent one of the bit line structures. The connection provides selective electrical conduction between the word line and the selected bit line upon activation by the word line.

The column sense logic units are associated with corresponding ones of the bit line structures. Each of the column sense logic units includes a first logic gate having a first input electrically interconnected with a first one of the bit lines in the corresponding one of the bit line structures and a second input electrically interconnected with a second one of the bit lines in the corresponding one of the bit line structures. Further, each of the column sense logic units also includes a second logic gate that has a first input electrically interconnected with a third one of the bit lines in the corresponding one of the bit line structures and a second input electrically interconnected with the second one of the bit lines in the corresponding one of the bit line structures.

Circuits embodying the invention can be fabricated, for example, on a semi-conductor wafer, and can be used in computing apparatuses.

In another aspect, an exemplary method of operating a memory circuit includes the step of providing a memory circuit. The memory circuit is similar to that described, and can also include a column multiplexer electrically interconnected with outputs of the first and second logic gates, and configured to select which of the column sense logic units to read from. The method can also include the step of activating a given one of the word lines and making the outputs of the logic gates available to the multiplexer substantially immediately following activation of the given one of the word lines.

A more complete understanding of the present invention, as well as further features and advantages of the present invention, will be obtained by reference to the following detailed description and drawings.

DETAILED DESCRIPTION

Figure 1:
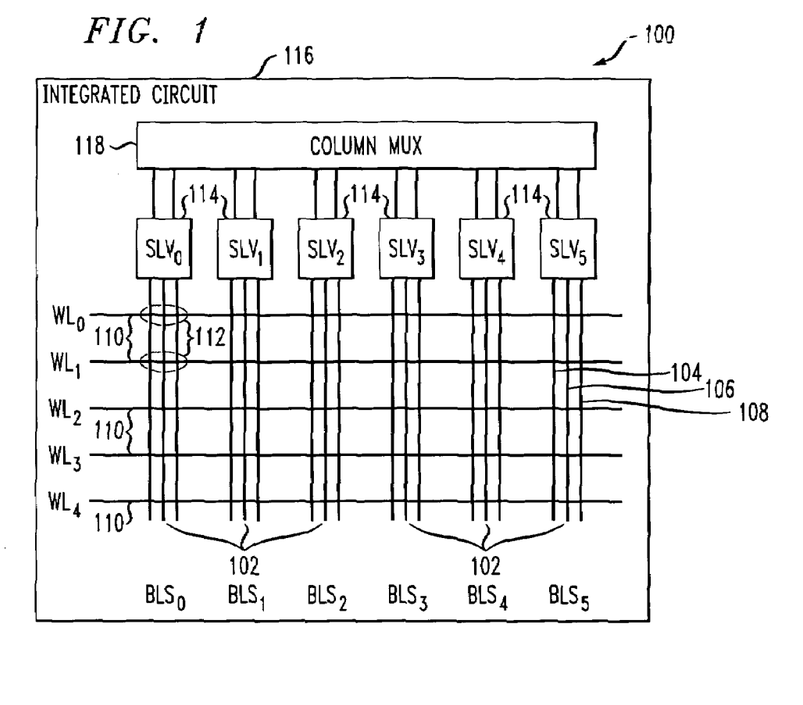
FIG. 1 illustrates an integrated circuit according to an exemplary embodiment of the present invention.

FIG. 1 shows an exemplary embodiment of a memory circuit 100 in accordance with an aspect of the present invention. Circuit 100 is one specific example of what may be more generally referred to as memory circuitry, and it will be appreciated that numerous other alternative implementations are possible within the teachings of the present invention. Circuit 100 includes a plurality of bit line structures 102. Each of the bit line structures 102 includes at least three bit lines, for example, those numbered 104, 106 and 108. The bit line structures 102 are designated as $BLS_0$, $BLS_1, \ldots BLS_5$. It will be appreciated that any desired number of bit line structures can be provided. It will be further appreciated that memory circuitry such as exemplary circuit 100, employing techniques of the present invention, may be realized, e.g., as a stand-alone integrated circuit or as a portion of an integrated circuit that performs other functions. By way of example and not limitation, such an integrated circuit could be a processor having memory circuitry such as ROM circuitry, employing techniques of the present invention, for storing instructions or the like. Furthermore, while described with respect to ROM circuitry, other types of memory circuitry where it was desirable to have bit line structures with multiple bit lines, including multi-level bit line configurations, could employ techniques of the present invention.

Circuit 100 also includes a plurality of word lines 110. Word lines 110 intersect with bit line structures 102 at a plurality of sites 112. A plurality of switching devices, to be discussed in greater detail below, can be provided. Individual ones of the switching devices can be located at selected ones of the sites and can be connected between an adjacent one of the word lines 110 and a selected one of the bit lines 104, 106, 108 of an adjacent one of the bit line structures 102. Thus, selective electrical conduction can be provided between the adjacent one of the word lines and the selected one of the bit lines, upon activation of the given switching device by the adjacent one of the word lines.

Note that the word lines are designated as $WL_0$, $WL_1, \ldots WL_4$. It will be appreciated that any desired number of word lines can be provided.

Circuit 100 can also include a plurality of column sense logic units 114. The column sense logic units are designated as $SLU_0, SLU_1, \ldots SLU_5$. Each of the column sense logic units can be associated with a corresponding one of the bit line structures 102. As many as are desired can be provided. The column sense logic units can include first and second logic gates, as will be discussed more fully below.

It will be appreciated that some or all of the elements of circuit 100 can be formed on an integrated circuit 116.

Circuit 100 can also include a column multiplexer 118 that is electrically interconnected with the outputs of the first and second logic gates of the sense logic units 114 in a manner to be discussed further below. The column multiplexer 118 can be configured to select which of the column sense logic units 114 is to be read from.

Figure 2:
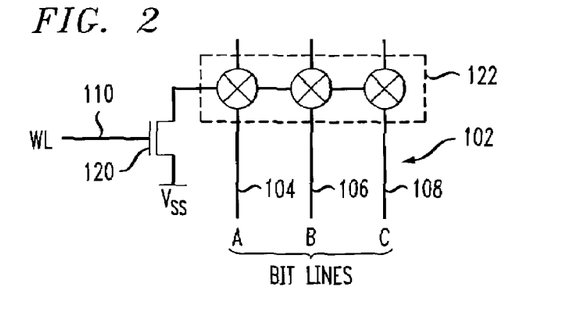
FIG. 2 illustrates a typical site of the circuit of FIG. 1.

Attention should now be given to FIG. 2. FIG. 2 depicts an individual site 112. Note word line 110 and bit lines 104, 106, 108 of bit line structure 102. A switching device such as transistor 120 is provided at the site and is connected between the adjacent word line 110 and a selected one of the bit lines 104, 106, 108 of the bit line structure 102. It will be appreciated that activation of a given word line 110 causes transistor 120 to become conductive such that the desired logical value appears on the given one of the bit lines A, B, C. In the exemplary embodiment depicted in FIG. 2, transistor 120 is a field effect transistor (FET). As shown in FIG. 2, FET 120 is an n-type FET (NFET). It will be appreciated that a p-type FET (PFET) or other suitable switching device can also be employed. Preferably, FET 120 is selectively electrically interconnected to the selected bit line 104, 106, or 108 via a programmable contact window 122, which permits programming during the manufacturing process. Specifically, window 122 permits transistor 120 to be connected to any one of the bit lines 104, 106, 108, or to none of the bit lines. Further details regarding a programmable contact window will be provided below.

Figure 3:
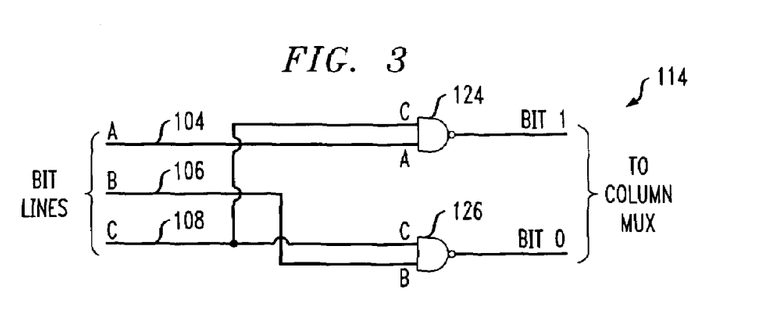
FIG. 3 illustrates an exemplary embodiment of a column sense logic unit according to an aspect of the present invention.

Attention should now be given to FIG. 3, which depicts an exemplary column sense logic unit 114 according to one aspect of the present invention. Unit 114 includes a first logic gate 124 and a second logic gate 126. Gate 124 has a first input electrically interconnected with a first one of the bit lines 104, designated as A. Further, first gate 124 has a second input electrically interconnected with a second one of the bit lines 108, designated as C. Second gate 126 has a first input electrically interconnected with a third one of the bit lines 106, designated as B and also has a second input electrically interconnected with the second one of the bit lines 108 and designated as C. It will be appreciated that bit lines A, B, C are the aforementioned at least three bit lines in a corresponding one of the bit line structures 102.

Each of the sites 112 can be configured to store at least two bits of information. The information can be encoded according to the following table. Note that bit 0 is the output of logic gate 126 while bit 1 is the output of logic gate 124.

| bit line A | bit line B | bit line C | bit 0 | bit 1 |
|---|---|---|---|---|
| inactive | inactive | inactive | 0 | 0 |
| active | inactive | inactive | 0 | 1 |
| inactive | active | inactive | 1 | 0 |
| inactive | inactive | active | 1 | 1 |

Thus, it will be appreciated that first logic gate 124 decodes bit 1 while second logic gate 126 decodes bit 0. Of course, each of logic gates 124 and 126 can be provided with an output at which the decoded bit appears. In the exemplary embodiment shown in FIG. 3, the first and second logic gates 124, 126 are NAND gates. It will be appreciated that alternative logical structures producing logically equivalent outputs for corresponding inputs could be employed instead. In one or more exemplary embodiments of the invention, the outputs of the logic gates 124, 126 can be made available to the multiplexer 118 substantially immediately following the activation of the adjacent one of the word lines 110. In the exemplary embodiment discussed thus far, wherein NFETs are employed, it will be appreciated that an "inactive" entry in the above table denotes a logical "high" state and an "active" entry in the table denotes a logical "low" state. Of course, the polarities can be adjusted if different types of transistors or switching devices are employed. It will be appreciated that in the exemplary embodiment discussed thus far, the "low" state can be achieved via pull-down through a corresponding one of the NFETs 120. That is, when transistor 120 becomes conductive upon activation of its gate by word line 110, current flows between the first and second drain-source regions of transistor 120 so as to set the corresponding bit line equal to $V_{SS}$.

Figure 4:
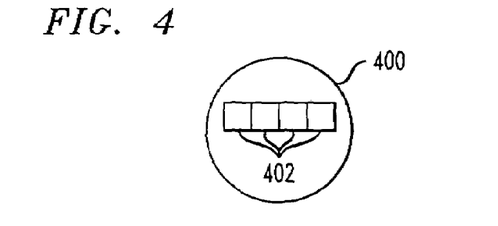
FIG. 4 depicts a semi-conductor wafer having one or more inventive circuits formed thereon.

Referring now to FIG. 4, it will be appreciated that in one aspect, the present invention contemplates a semi-conductor wafer 400 having a plurality of integrated circuits 402 formed thereon. One or more of the circuits 402 can be a memory circuit of the kind described above.

Figure 5:
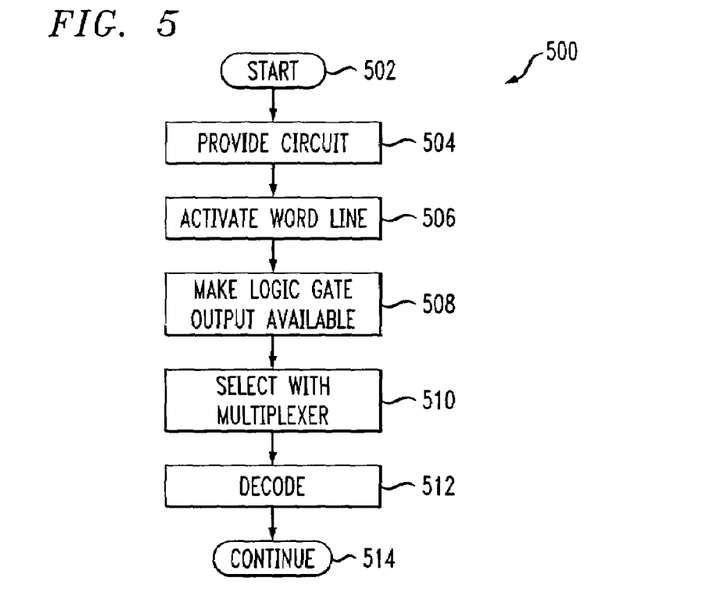
FIG. 5 is a flow chart of an exemplary method for operating a memory circuit according to an aspect of the present invention.

FIG. 5 depicts a flow chart 500 of exemplary method steps in a method, according to another aspect of the invention, of operating a memory circuit. After beginning at block 502, block 504 includes providing a circuit of the kind described above. At block 506, a given one of the word lines is activated, while at block 508, the outputs of the logic gates are made available to the multiplexer substantially immediately following activation of the given one of the word lines.

Optionally, additional step 510 can include selecting which of the column sense logic units to read from, with the multiplexer. Optional step 512 can include decoding the outputs of the logic gates according to the table presented above. The flow continues at block 514.

Figure 6:
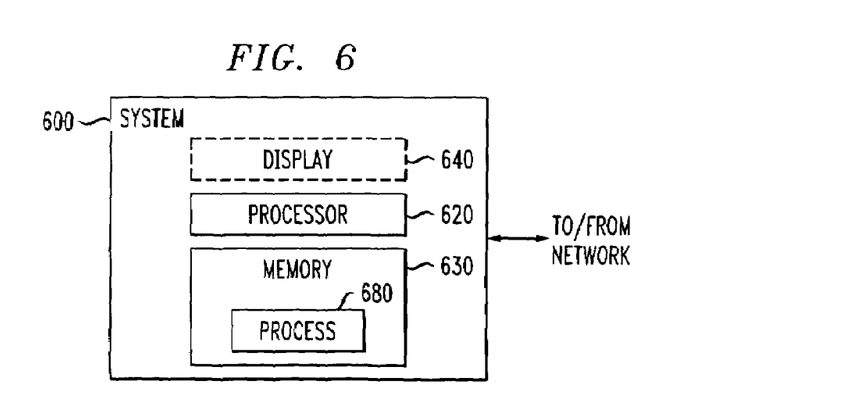
FIG. 6 is an example of one type of computer system that can employ circuits according to the present invention.

FIG. 6 is a block diagram of a computer system 600 that can employ ROMs using techniques of the present invention. As shown in FIG. 6, memory 630 configures the processor 620 to implement methods, steps, and functions (collectively, shown as 680 in FIG. 6). The memory 630 could be distributed or local and the processor 620 could be distributed or singular. The memory 630 could be implemented as an electrical, magnetic or optical memory, or any combination of these or other types of storage devices. It should be noted that each distributed processor that makes up processor 620 generally contains its own addressable memory space. It should also be noted that some or all of computer system 600 can be incorporated into an application-specific or general-use integrated circuit. Thus, the present invention contemplates a computing apparatus having a memory, an input output device, and at least one processor coupled to the memory and the input output device and operative to execute instructions. At least some of the instructions can be stored in the memory. The memory can be a ROM according to one or more embodiments of the present invention. Of course, a ROM according to the present invention may be only one of the memories in system 600. A ROM may store permanent information, such as for "booting up," while a Random Access Memory (RAM) may be provided for executing application programs, and disks or other memories may also be employed.

Figure 7:
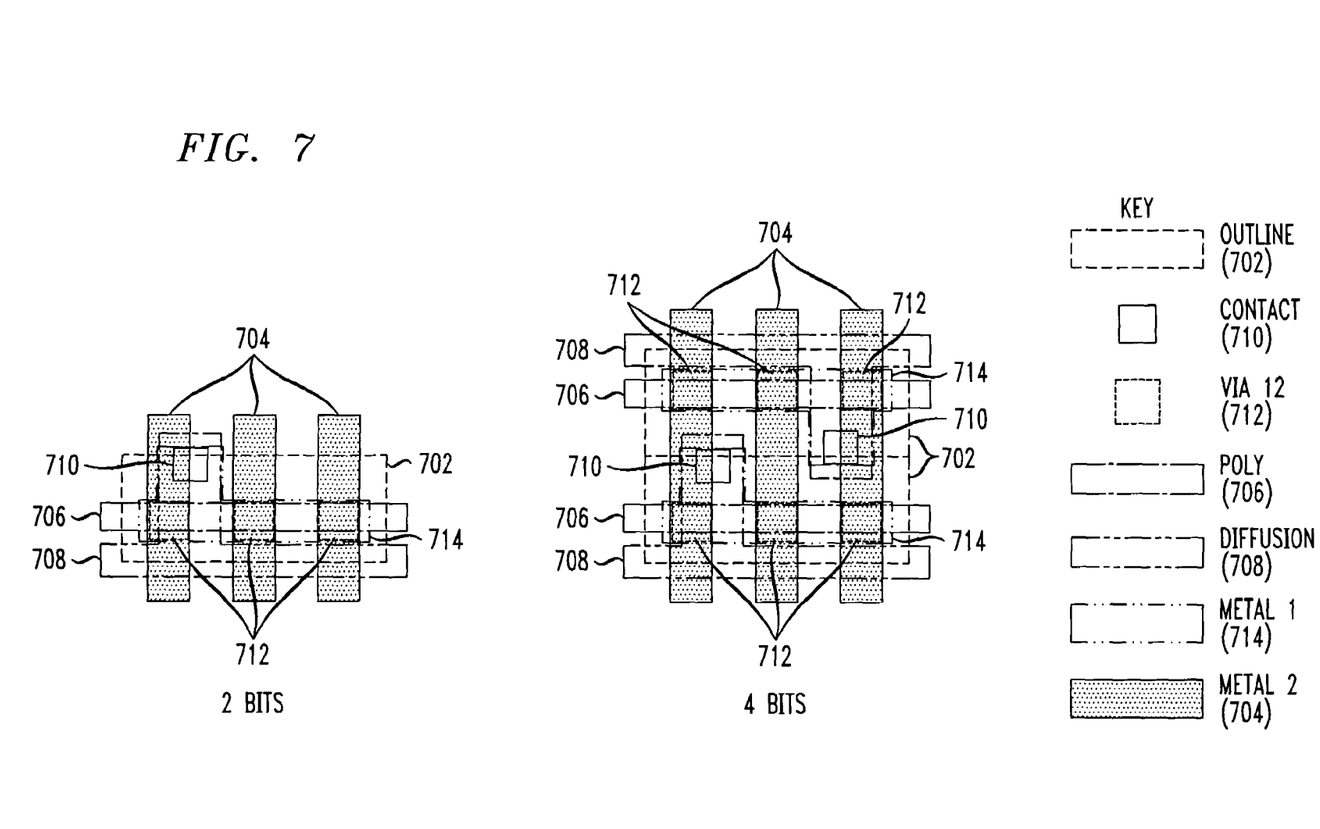
FIG. 7 is a top view of an exemplary layout of an integrated circuit according to an aspect of the present invention showing transistor and metal levels.

Attention should now be given to FIG. 7, which is a top (plan) view of an exemplary layout of an integrated circuit (the layouts depicted in FIGS. 7-13 can be stand alone memory circuits or examples of memory circuitry on integrated circuits performing other functions as well, e.g., processors) according to an aspect of the present invention, depicting both transistor and metal levels. The leftmost portion of the figure depicts a single site storing two bits while the central portion of the figure depicts two such sites nested together, with a total storage of four bits. The smallest repeatable outline is denoted as 702. A plurality of bit line structures of the kind described above, each including at least three bit lines 704, can be provided. As will be discussed more fully below, in the exemplary embodiment depicted in FIG. 7, the bit line 704 can be formed in a second metal layer. A plurality of word lines of the kind described above can also be provided; these can be formed of polysilicon and are indicated as reference characters 706. As described above, the word lines 706 intersect with the bit line structures at a plurality of sites; each individual site constitutes a repeatable portion 702. A plurality of switching devices can be provided and individual switching devices can be located at selected ones of the sites. In one embodiment, a switching device is included at each site and is connected to one or none of the bit lines 704 via a programmable contact window.

Figure 8:
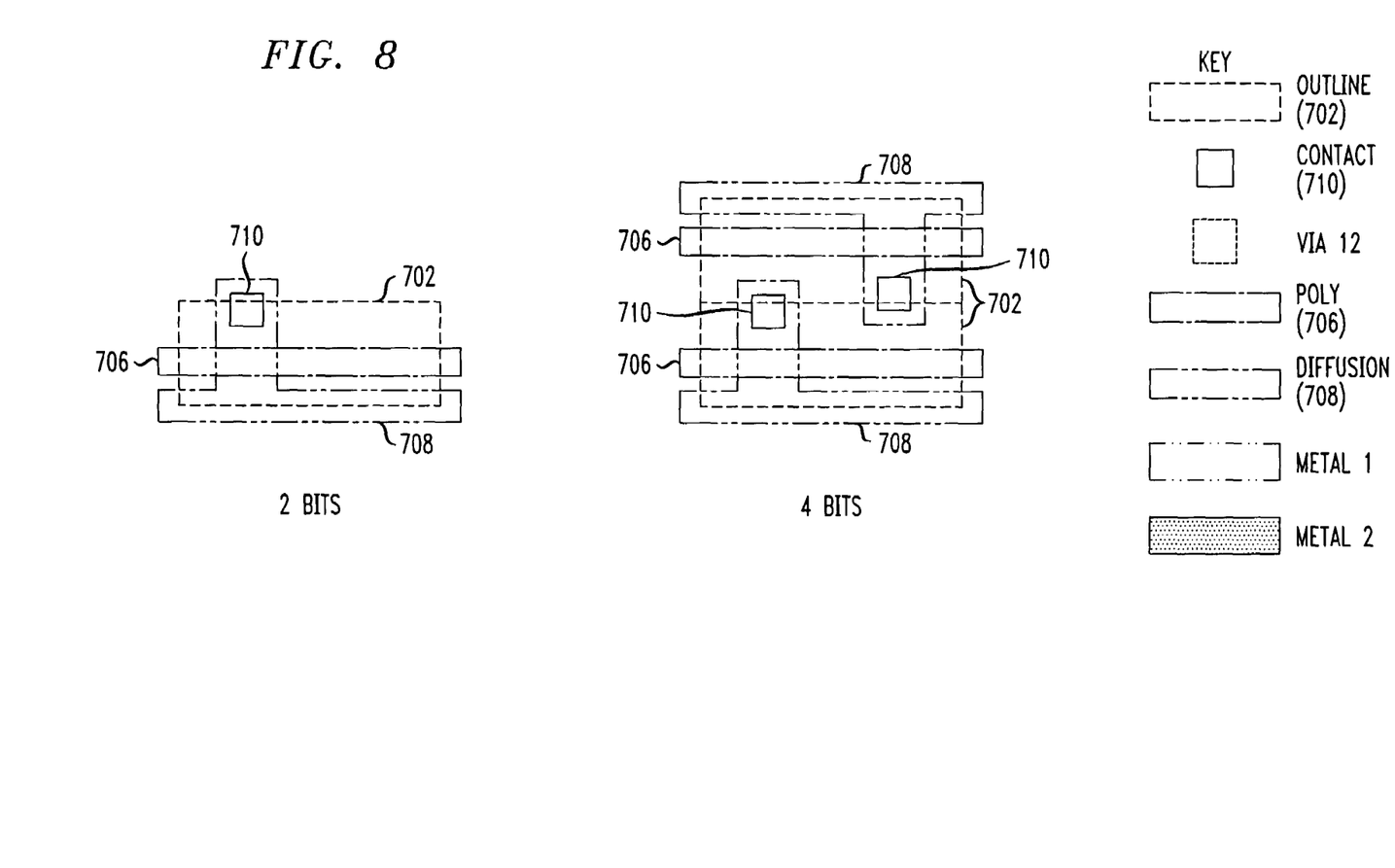
FIG. 8 is a layout similar to that of FIG. 7 depicting a transistor level.
Figure 9:
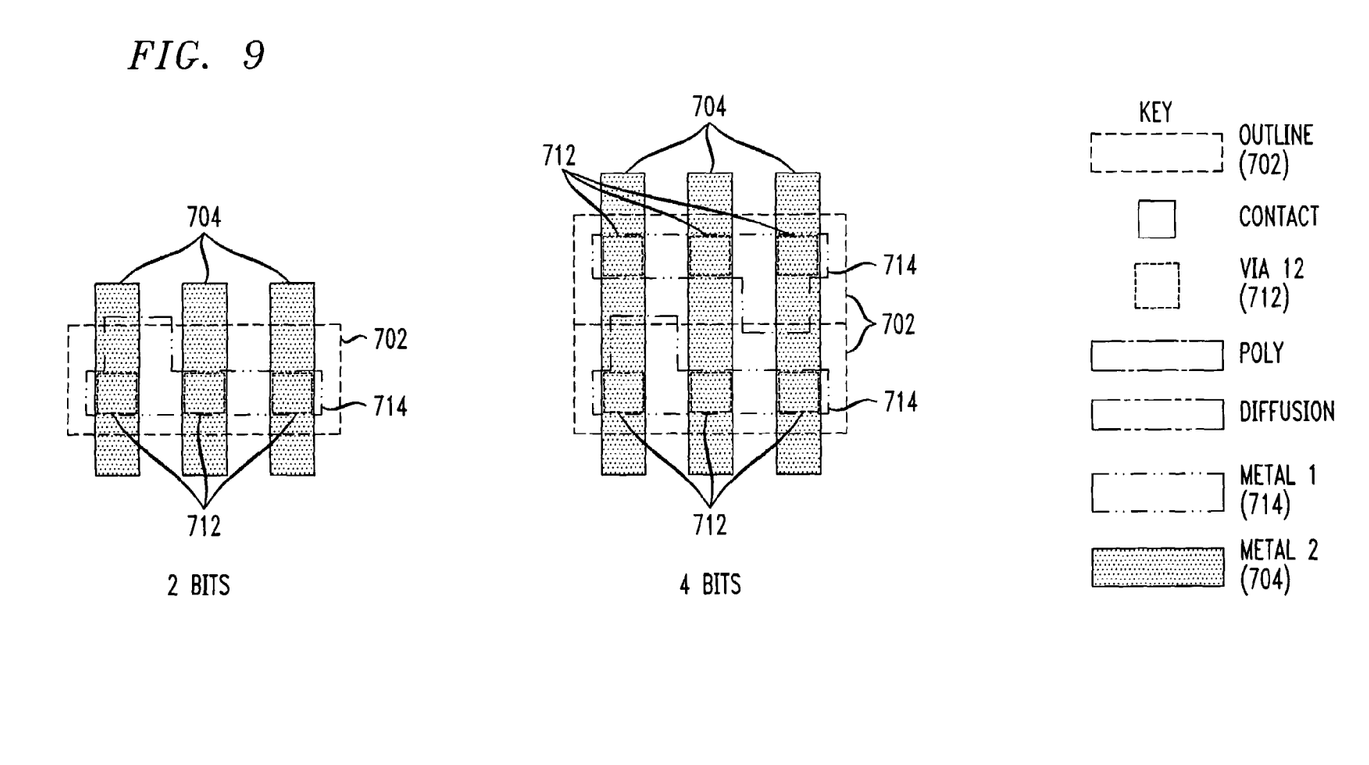
FIG. 9 is a layout similar to that of FIGS. 7 and 8 depicting metal levels.

A plurality of diffusion regions 708 can form a plurality of $V_{SS}$ planes that are interconnected with the aforementioned switching devices. Further details will be provided with regard to FIG. 8. The structure depicted in FIGS. 7-9 includes a transistor level, a first insulation layer spaced outward of the transistor level, a first metal level spaced outward of the first insulation layer, a second insulation layer spaced outward of the first metal level, and a second metal level spaced outward of the second insulation layer. The focus in FIGS. 7-9 is on the transistor (device) level and the metal levels. Given the teaching herein, the skilled artisan will appreciate how to manufacture the various device, metal, and insulation layers. Contacts 710 can be formed to connect the transistor level to the first metal level, while vias 712 can be formed to interconnect the first and second metal levels. Metal region 714 can be provided in order to facilitate interconnection between the switching devices and a desired one of the bit lines 704, in conjunction with the contacts 710 and vias 712.

Giving attention now to FIG. 8, it will be appreciated that the diffusion regions 708 form a plurality of $V_{SS}$ planes interconnected with the switching devices. The devices and the planes are formed at the first, transistor level. As best seen in the middle of the figure labeled "four bits" the $V_{SS}$ planes are preferably formed as substantially complementary interlocking regions that also form functional portions of the switching devices. The interlocking regions can be substantially L-shaped as depicted in the figure. Word lines 706 can also be formed at the first, transistor level. In the example shown in FIG. 8, the switching devices are FETs having gates and drain-source regions. The word lines 706 can be formed from polysilicon and can function as gates of the FETs. The interlocking regions 708, as noted, can be formed from the diffusion material. The functional portions of the FETs that are formed by the interlocking regions can be the drain-source regions of the FETs.

Referring now to FIG. 9, and with continued reference to FIGS. 7 and 8, in the exemplary embodiment depicted in the figures, the bit line structures formed by bit lines 704 are formed at the "Metal 2" level, which comprises a second level spaced from the first or transistor level. The contacts 710, "Metal 1" layer including regions 714, and the vias 712 effectively form an interconnection level between the first (transistor) and second ("Metal 2") levels. It will be appreciated that the interconnection level is configured to connect given ones of the switching devices and selected ones of the bit lines 704. Thus, the interconnection level can include a plurality of contacts 710 extending outward from each of the interlocking diffusion regions 708, a plurality of conductive regions 714 having outlines generally coextensive with the interlocking regions 708, and a plurality of vias 712. Each of the vias can connect a corresponding one of the conductive regions 714 with a selected one of the bit lines 704. Each of the conductive regions 714 is connected to at most one of the bit lines 704. Thus, the aforementioned programmable contact window can be readily formed by the (potential) vias 712; and the appropriate interconnections are achieved by providing one via 712 to connect a given region 714 with a corresponding bit line 704, or providing no vias such that the switching devices at the given site is not connected. The terminology "potential" is applied to the vias because even though all possible via locations are shown in the figures, in actuality, only the via needed for the desired connection is employed (in the example shown in the figures, when it is desired to store a "00" value, the conductive region 714 can be isolated from the corresponding bit lines 704 by not providing any via 712).

As noted, the interlocking diffusion regions 708 and the interlocking metallic regions 714 can both be substantially L-shaped. Thus, the FET formed by the diffusion regions 708 includes the integral $V_{SS}$ plane with a gate formed by a polysilicon word line 706 separating the two drain-source regions. Each FET will conduct upon activation by the associated word line 706, causing the voltage $V_{SS}$ to appear on whichever one of the bit lines 704 is interconnected to metal region 714 by a via 712. It will be appreciated that if no via is provided, even when the adjacent word line 706 becomes active, the $V_{SS}$ voltage does not appear on any of the bit lines since there is no interconnection.

The exemplary embodiment depicted in FIGS. 7-9 uses approximately 15% less die area than conventional techniques to store the same amount of information.

Figure 10:
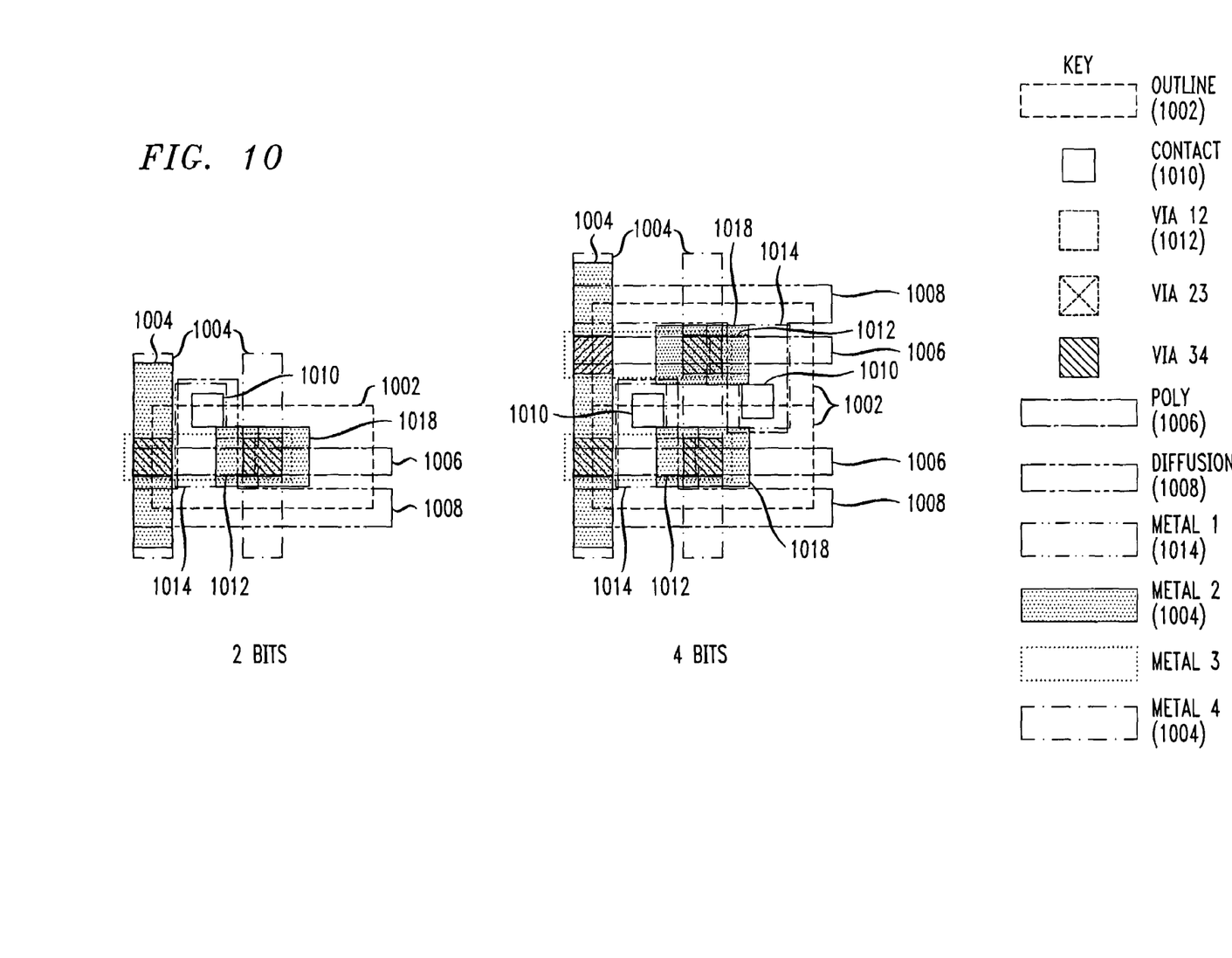
FIG. 10 is a top view of an exemplary layout of an integrated circuit according to another aspect of the present invention showing transistor and metal levels.

Attention should now be given to FIG. 10 which is a top (plan) view of an exemplary layout of an integrated circuit according to another aspect of the present invention, showing transistor and metal levels. In the exemplary embodiment shown in FIG. 10, the smallest repeatable region is identified as element 1002. A plurality of bit line structures, each including at least three bit lines 1004, are provided. In the exemplary embodiment depicted in FIG. 10, the bit lines are located on different levels, as will be discussed more fully below. A plurality of polysilicon word lines 1006 can be provided. These can intersect with the bit line structures formed by bit lines 1004 at a plurality of sites indicated by repeating portions 1002. A plurality of switching devices can be provided, and individual ones of the switching devices can be located at selected ones of the sites; in the exemplary embodiment depicted in FIG. 10, a switching device is provided at every site. Further details on the construction of the switching devices will be presented below.

The exemplary embodiment depicted in FIG. 10 includes a transistor level, a first insulation layer spaced outwardly of the transistor level, a "Metal 1" layer spaced outwardly of the first insulation layer, a second insulation layer spaced outwardly of the "Metal 1" layer, a "Metal 2" layer spaced outwardly of the second insulation layer, a third insulation layer spaced outwardly of the "Metal 2" level, a "Metal 3" level spaced outwardly of the third insulation layer, a fourth insulation layer spaced outwardly of the "Metal 3" level, and a "Metal 4" level spaced outwardly of the fourth insulation layer. The focus in FIGS. 10-13 is on the transistor (device) level and the metal levels. Given the teaching herein, the skilled artisan will appreciate how to manufacture the various device, metal, and insulation layers.

At least one of the three bit lines 1004 of the bit line structures can be formed at the "Metal 4" layer, while at least a second one of the bit lines 1004 of the bit line structures can be formed at the "Metal 2" layer. In the exemplary embodiment depicted in FIG. 10, two of the three bit lines 1004 are formed at the "Metal 4" layer, while one of the bit lines 1004 in a given bit line structure is formed at the "Metal 2" layer. Diffusion regions 1008 and contacts 1010 can be provided in a manner similar to that described with respect to FIGS. 7-9. The polysilicon word lines 1006 together with the diffusion regions 1008 can form a plurality of devices and $V_{SS}$ planes in a manner similar to that described above with regard to FIGS. 7-9. The switching devices (FETS in the exemplary embodiment depicted) can be connected between an adjacent one of the word lines 1006 and a selected one of the bit lines 1004 of an adjacent one of the bit line structures for selective electrical conduction upon activation by the word line 1006. The connection can be provided in a manner best seen with continued reference to FIG. 10, as well as reference to FIGS. 11-13 discussed below. Note that in the exemplary embodiment depicted in FIG. 10, one of the bit lines 1004 formed at the "Metal 4" level is substantially coextensive with the bit line 1004 formed at the "Metal 2" level when viewed in plan (i.e., a top plan view from a vantage point perpendicular to the plane of the integrated circuit) as shown in the figure. Stated another way, one of the bit lines is located on top of one of the other bit lines, to save space. As noted, in the exemplary embodiment depicted, two of the bit lines are located at the "Metal 4" level.

It will be appreciated that the "Metal 4" layer can be thought of as a first level, while the "Metal 2" layer can be thought of as a second level. Further, the transistor level can be thought of as a third level. Thus, the "Metal 3" level with its associated vias can be thought of as forming a first interconnection level between the "Metal 2" and "Metal 4" levels, while the "Metal 1" layer and its associated vias and contacts can be thought of as forming a second interconnection level between the "Metal 2" level and the transistor level.

Figure 11:
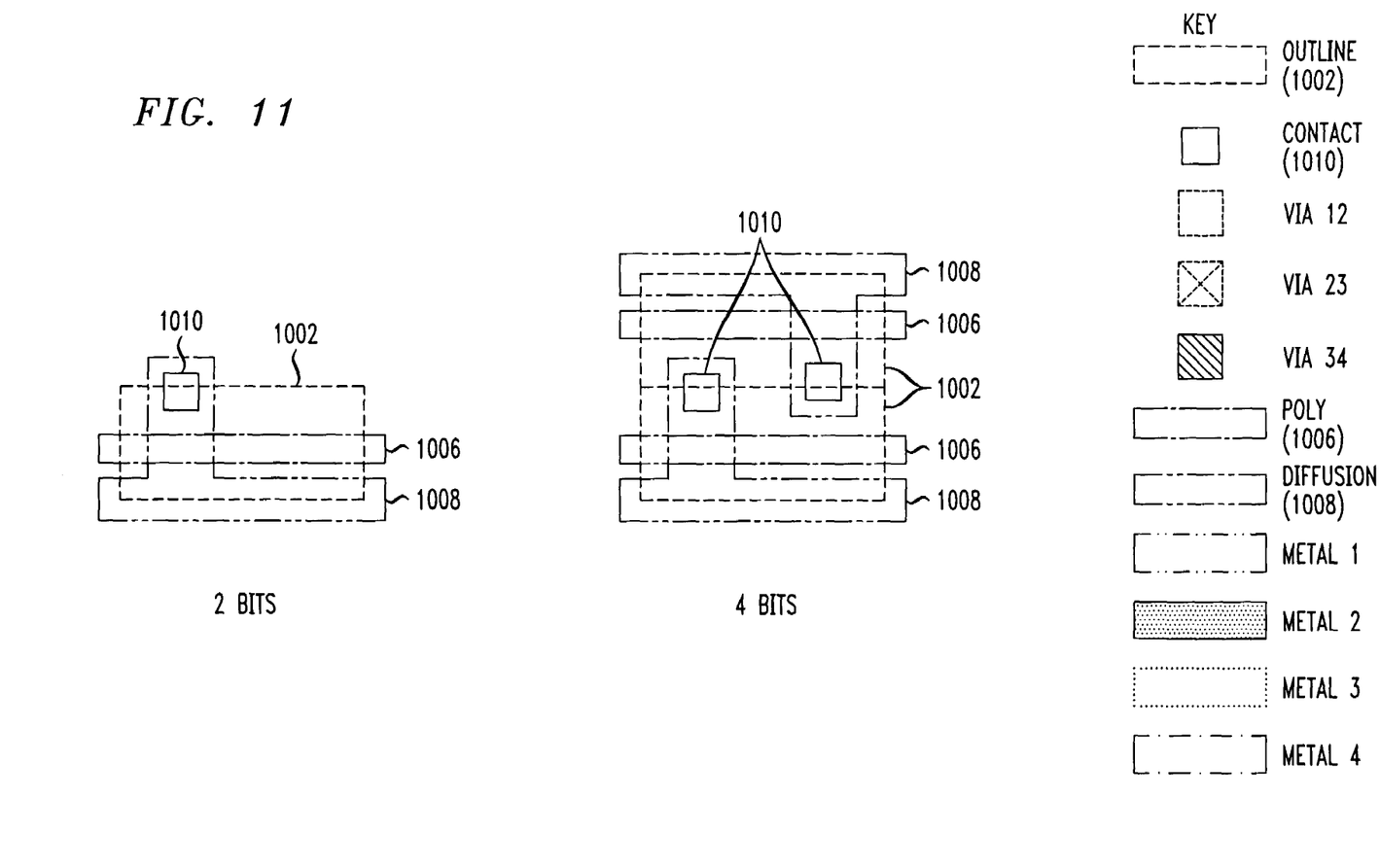
FIG. 11 is a figure similar to FIG. 10 showing the transistor level.

Giving attention now to FIG. 11, depicting the transistor level, the repeating regions 1002, polysilicon word lines 1006, diffusion regions 1008 and contacts 1010 are depicted, and are essentially similar to those described above with respect to the embodiment depicted in FIG. 8.

Figure 12:
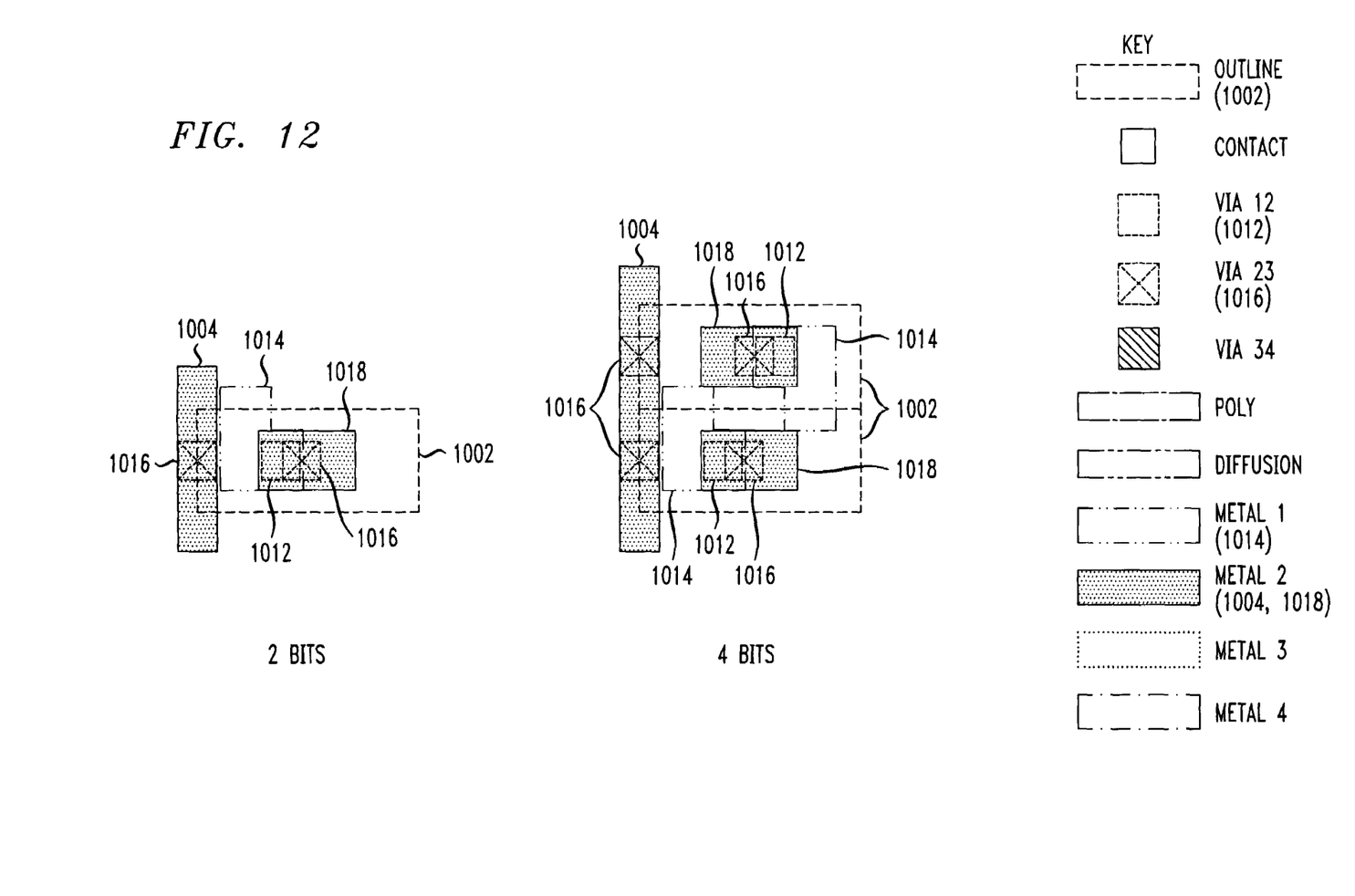
FIG. 12 is a figure similar to FIGS. 10 and 11 showing two of the metal levels of the exemplary circuit.

Turning now to FIG. 12, which depicts metal levels one and two, it can be seen that a plurality of conductive regions 1014, which can be generally L-shaped, can be provided at the "Metal 1" level, while one of the bit lines 1004 and a plurality of conductive islands 1018 can be formed at the "Metal 2" level. The aforementioned second interconnection level can include the contacts 1010 which extend outward from the interlocking diffusion regions 1008. The second interconnection level can also include the conductive regions 1014 in the "Metal 1" level. One of the conductive regions can be associated with a corresponding one of the conductive islands 1018 in the "Metal 2" level. A plurality of first vias, between the "Metal 1" and "Metal 2" levels, can also be provided. These are designated as elements 1012, and can connect a corresponding one of the conductive regions 1014 with its corresponding "Metal 2" island 1018.

Figure 13:
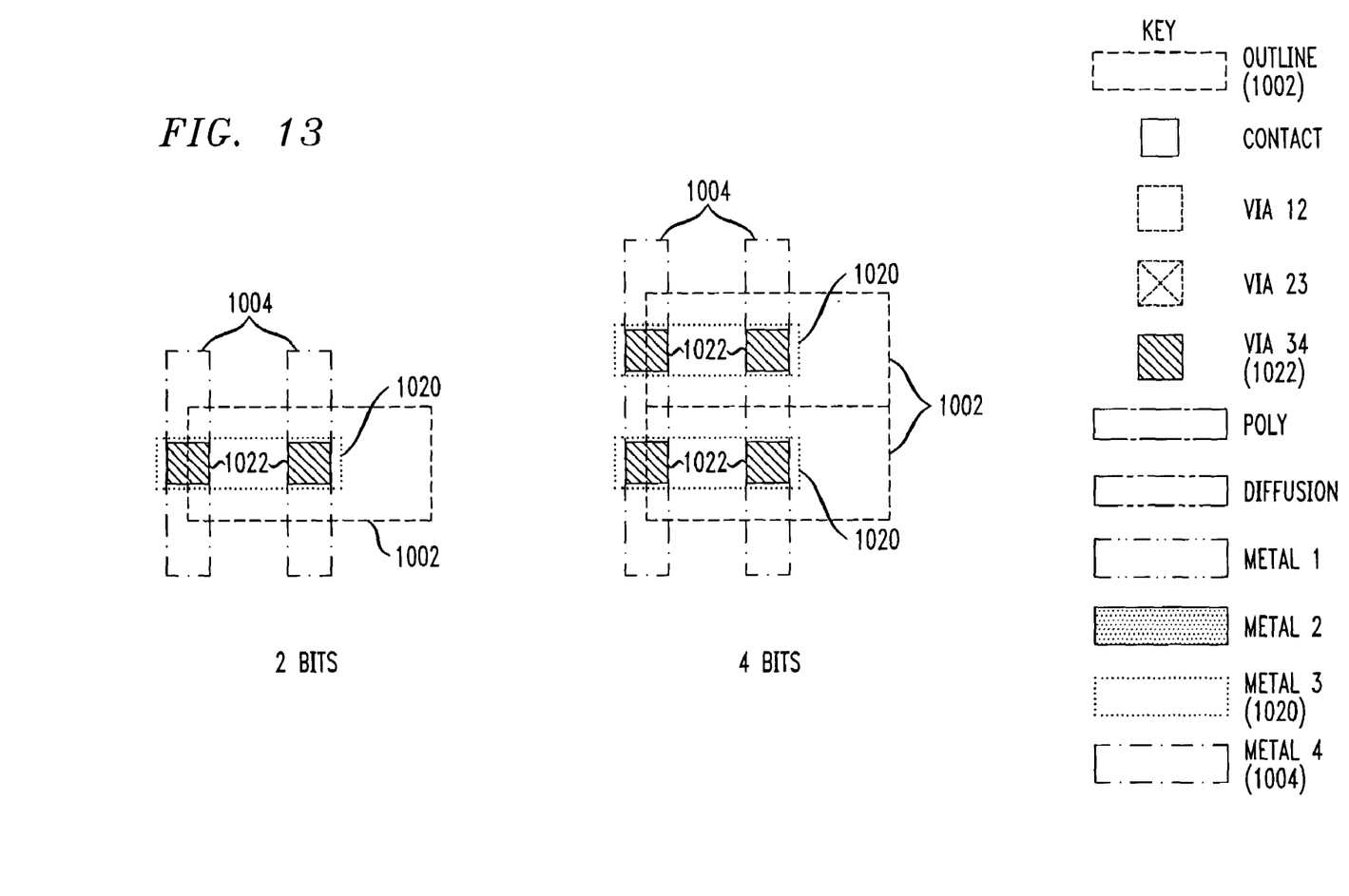
FIG. 13 is a figure similar to FIGS. 10-12 showing two additional metal levels.

Attention should now be given to FIG. 13, which depicts metal levels three and four in the exemplary embodiment. It will be appreciated that the aforementioned first interconnection level can include a plurality of jumpers 1020 formed at the "Metal 3" level. In the exemplary embodiment, these are substantially orthogonal to the bit lines 1004. One jumper 1020 can be associated with each one of the sites 1002. The first interconnection level can also include a plurality of second vias, designated as "VIA23" in the figures and best seen in FIG. 12 where they are labeled as elements 1016. These can be provided to interconnect the islands 1018 at the "Metal 2" level with the corresponding jumpers 1020 at the "Metal 3" level.

The first interconnection level can also include a plurality of third vias, also labeled as "VIA23" in the figures, which interconnect the "Metal 3" jumpers 1020 to the "Metal 2" bit lines 1004. Again, these elements 1016 are best seen in FIG. 12, and provide interconnection between selected ones of the jumpers and corresponding ones of the bit lines at the second level. The first interconnection level can also include a plurality of fourth vias, designated as "VIA34" in the figures and labeled as elements 1022. These can be configured to electrically interconnect selected ones of the jumpers 1020 with corresponding ones of the bit lines 1004 at the "Metal 4" level.

It will be appreciated that the structures just described provide the aforementioned programmable contact window for the exemplary embodiment depicted in FIGS. 10-13. In the exemplary embodiment, the programmable connections are those between the "Metal 3" jumper 1020 and the corresponding bit lines 1004. These are provided by the "via 34" elements designated as 1022, or by the "via 23" elements designated as 1016. It will be appreciated that the embodiment depicted in FIGS. 10-13 is exemplary, and in other embodiments, different connections could be fixed and variable to provide a different type of programmable contact window.

The exemplary embodiment depicted in FIGS. 10-13 uses approximately 28% less die area than conventional techniques to store the same amount of information.

Figure 14:
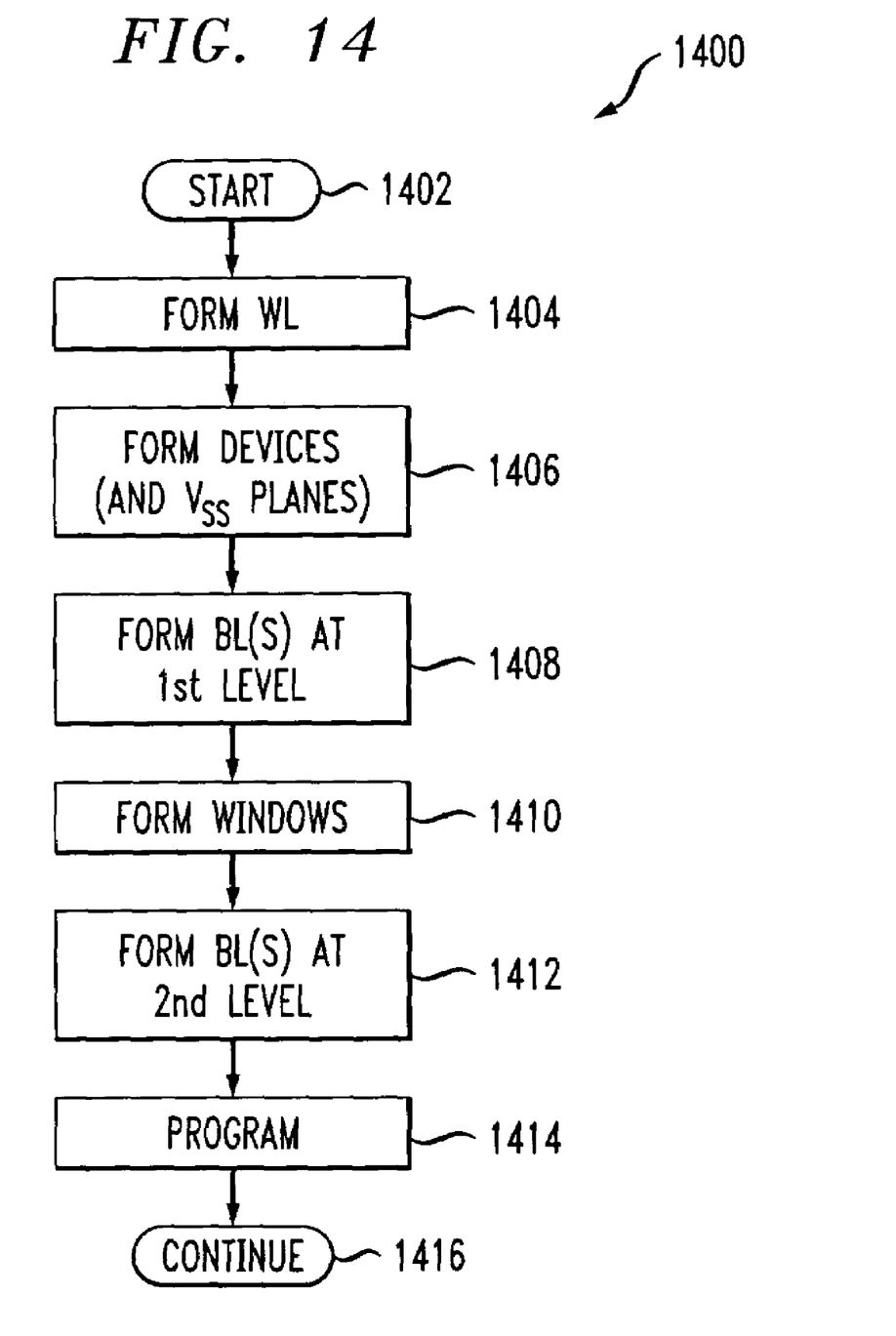
FIG. 14 is a flow chart of steps in an exemplary method for forming an integrated circuit, according to yet another aspect of the present invention.

FIG. 14 is a flow chart of steps in an exemplary method for forming an integrated circuit, according to yet another aspect of the present invention. The exemplary method can be employed in fabricating stand-alone memory circuits or memory circuitry on integrated circuits performing other functions as well, e.g., processors. The flow chart is designated generally as 1400. After beginning at block 1402, a plurality of word lines can be formed at block 1404. Further, a plurality of switching devices can be formed at block 1406. Yet further, a plurality of bit lines can be formed at a first level 1408. The programmable contact windows, as described above, can be formed as shown at block 1410, while if a second level of bit lines are to be employed, these can be formed at block 1412. The structure can then be programmed to store the desired information as shown at block 1414, and the process can continue as shown at block 1416.

It will be appreciated that the bit lines formed in the process can be formed as bit line structures of the kind described above, which can intersect with the word lines at a plurality of sites where the switching devices are located. The programmable contact windows formed in step 1410 can provide selective electrical interconnection of given ones of the switching devices with given appropriate ones of the bit lines and corresponding ones of the bit line structures. At least two bits of information can be programmed into each one of the sites by the aforementioned selective electrical interconnection using the programmable contact windows. Of course, the case where no interconnection is provided for example, to store a "00" value, is also contemplated.

Step 1412 is optional and can be provided in the case when bit lines are to be formed at two levels. In such a case, at least a first one of the at least three bit lines can be formed at a first level and at least a second one of the at least three bit lines can be formed at a second level different from the first level. As suggested by the parenthetic notation in block 1406, a plurality of $V_{SS}$ planes can be formed interconnected with the switching devices. The planes and devices can be formed at a first level, and the planes can be formed as substantially complementary interlocking regions, of the kind described herein, that also form functional portions of the switching devices.

The steps depicted in FIG. 14 are exemplary in nature, and may be performed in a different order, or one or more steps may be omitted or one or more additional steps may be added.

At least a portion of the techniques of the present invention described herein may be implemented in an integrated circuit. In forming integrated circuits, a plurality of identical die are typically fabricated in a repeated pattern on a surface on a semiconductor wafer. Each die can include an entire circuit or elements as described herein, and can include other structures or circuits. The individual die are cut or diced from the wafer and then packaged as an integrated circuit. One skilled in the art will know how to dice wafers and package die to produce integrated circuits. Integrated circuits so manufactured are considered part of this invention. Further, from the descriptions of the various levels and layers provided herein, the skilled artisan will be able to develop appropriate mask sets for fabricating integrated circuits according to one or more embodiments of the present invention.

Although illustrative embodiments of the present invention have been described herein, it is to be understood that the invention is not limited to those precise embodiments, and that various other changes and modifications may be made by one skilled in the art without departing from the scope of the invention as set forth in the appended claims.

We claim:

1. A memory circuit, comprising:
    a plurality of bit line structures, each of said bit line structures comprising at least three bit lines;
    a plurality of word lines, said word lines intersecting with said bit line structures at a plurality of sites;
    a plurality of switching devices, individual ones of said switching devices being located at selected ones of said sites and being connected between an adjacent one of said word lines and a selected one of said bit lines of an adjacent one of said bit line structures for selective electrical conduction therebetween upon activation by said adjacent one of said word lines; and
    a plurality of column sense logic units, each of said column sense logic units being associated with a corresponding one of said bit line structures, each of said column sense logic units in turn comprising:
        a first logic gate having a first input electrically interconnected with a first one of said bit lines in said corresponding one of said bit line structures and a second input electrically interconnected with a second one of said bit lines in said corresponding one of said bit line structures; and
        a second logic gate having a first input electrically interconnected with a third one of said bit lines in said corresponding one of said bit line structures and a second input electrically interconnected with said second one of said bit lines in said corresponding one of said bit line structures.

2. The memory circuit of claim 1, wherein said circuit is formed as an integrated circuit.

3. The memory circuit of claim 1, wherein:
    with respect to a given one of said column sense logic units, said first one of said bit lines is designated as A, said second one of said bit lines is designated as C, and said third one of said bit lines is designated as B; and
    each of said sites is configured to store at least two bits of information, said information being encoded according to the following table:

| bit line A | bit line B | bit line C | bit 0 | bit 1 |
|---|---|---|---|---|
| inactive | inactive | inactive | 0 | 0 |
| active | inactive | inactive | 0 | 1 |
| inactive | active | inactive | 1 | 0 |
| inactive | inactive | active | 1 | 1. |

4. The memory circuit of claim 3, wherein said first logic gate is configured to decode said bit 1 and said second logic gate is configured to decode said bit 0.

5. The memory circuit of claim 3, wherein each of said first logic gates and each of said second logic gates has an output, further comprising a column multiplexer electrically interconnected with said outputs of said first and second logic gates, said column multiplexer being configured to select which of said column sense logic units to read from.

6. The memory circuit of claim 5, wherein said outputs of said logic gates are available to said multiplexer substantially immediately following said activation of said adjacent one of said word lines.

7. The memory circuit of claim 3, wherein said switching devices comprise field effect transistors (FETs).

8. The memory circuit of claim 7, wherein said FETs comprise n-type FETs (NFETS).

9. The memory circuit of claim 8, wherein said "inactive" entry in said table denotes a logical "high" state and said "active" entry in said table denotes a logical "low" state.

10. The memory circuit of claim 9, wherein said "low" state is achieved via pull-down through a corresponding one of said NFETs.

11. The memory circuit of claim 3, wherein said first and second logic gates comprise NAND gates.

12. The memory circuit of claim 1, wherein said individual ones of said switching devices are connected between said adjacent one of said word lines and said selected one of said bit lines of said adjacent one of said bit line structures via a programmable contact window.

13. The memory circuit of claim 1, wherein said circuit is formed as an integrated circuit.

14. A semiconductor wafer comprising a plurality of integrated circuits, at least one of the plurality of integrated circuits comprising:
   a plurality of bit line structures, each of said bit line structures comprising at least three bit lines;
   a plurality of word lines, said word lines intersecting with said bit line structures at a plurality of sites;
   a plurality of switching devices, individual ones of said switching devices being located at selected ones of said sites and being connected between an adjacent one of said word lines and a selected one of said bit lines of an adjacent one of said bit line structures for selective electrical conduction therebetween upon activation by said adjacent one of said word lines;
   a plurality of column sense logic units, each of said column sense logic units being associated with a corresponding one of said bit line structures, each of said column sense logic units in turn comprising:
      a first logic gate having a first input electrically interconnected with a first one of said bit lines in said corresponding one of said bit line structures and a second input electrically interconnected with a second one of said bit lines in said corresponding one of said bit line structures; and
      a second logic gate having a first input electrically interconnected with a third one of said bit lines in said corresponding one of said bit line structures and a second input electrically interconnected with said second one of said bit lines in said corresponding one of said bit line structures.

15. A computing apparatus, comprising:
   a memory;
   an input output device; and
   at least one processor, coupled to said memory and said input output device and operative to execute instructions, at least some of said instructions being stored in said memory;
   wherein said memory in turn comprises:
      a plurality of bit line structures, each of said bit line structures comprising at least three bit lines;
      a plurality of word lines, said word lines intersecting with said bit line structures at a plurality of sites;
      a plurality of switching devices, individual ones of said switching devices being located at selected ones of said sites and being connected between an adjacent one of said word lines and a selected one of said bit lines of an adjacent one of said bit line structures for selective electrical conduction therebetween upon activation by said adjacent one of said word lines; and
      a plurality of column sense logic units, each of said column sense logic units being associated with a corresponding one of said bit line structures, each of said column sense logic units in turn comprising:
         a first logic gate having a first input electrically interconnected with a first one of said bit lines in said corresponding one of said bit line structures and a second input electrically interconnected with a second one of said bit lines in said corresponding one of said bit line structures; and
         a second logic gate having a first input electrically interconnected with a third one of said bit lines in said corresponding one of said bit line structures and a second input electrically interconnected with said second one of said bit lines in said corresponding one of said bit line structures.

16. A method of operating a memory circuit, comprising the steps of:
   providing a memory circuit comprising:
      a plurality of bit line structures, each of said bit line structures comprising at least three bit lines;
      a plurality of word lines, said word lines intersecting with said bit line structures at a plurality of sites;
      a plurality of switching devices, individual ones of said switching devices being located at selected ones of said sites and being connected between an adjacent one of said word lines and a selected one of said bit lines of an adjacent one of said bit line structures for selective electrical conduction therebetween upon activation by said adjacent one of said word lines;
      a plurality of column sense logic units, each of said column sense logic units being associated with a corresponding one of said bit line structures, each of said column sense logic units in turn comprising:
         a first logic gate having an output and having a first input electrically interconnected with a first one of said bit lines in said corresponding one of said bit line structures and a second input electrically interconnected with a second one of said bit lines in said corresponding one of said bit line structures; and
         a second logic gate having an output and having a first input electrically interconnected with a third one of said bit lines in said corresponding one of said bit line structures and a second input electrically interconnected with said second one of said bit lines in said corresponding one of said bit line structures; and
      a column multiplexer electrically interconnected with said outputs of said first and second logic gates, said column multiplexer being configured to select which of said column sense logic units to read from;
   activating a given one of said word lines; and
   making said outputs of said logic gates available to said multiplexer substantially immediately following activation of said given one of said word lines.

17. The method of claim 16, further comprising the additional step of selecting which of said column sense logic units to read from, with said multiplexer.

18. The method of claim 17, wherein, with respect to a given one of said column sense logic units, said first one of said bit lines is designated as A, said second one of said bit lines is designated as C, and said third one of said bit lines is designated as B, and each of said sites is configured to store at least two bits of information;

further comprising the additional step of decoding said outputs of said logic gates according to the following table:

| bit line A | bit line B | bit line C | bit 0 | bit 1 |
|------------|------------|------------|-------|-------|
| inactive   | inactive   | inactive   | 0     | 0     |
| active     | inactive   | inactive   | 0     | 1     |
| inactive   | active     | inactive   | 1     | 0     |
| inactive   | inactive   | active     | 1     | 1.    |

* * * * *